(12) United States Patent
Nguyen et al.

(10) Patent No.: US 8,068,340 B1
(45) Date of Patent: *Nov. 29, 2011

(54) POWER SUPPLY WITH REVERSIBLE AIRFLOW DESIGN

(75) Inventors: Tri Luong Nguyen, San Jose, CA (US); Ankur Singla, San Jose, CA (US); Hogan Lew, Sunnyvale, CA (US); Stephen Strong, Fremont, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 218 days.

This patent is subject to a terminal disclaimer.

(21) Appl. No.: 12/492,326

(22) Filed: Jun. 26, 2009

(51) Int. Cl.
*H05K 7/20* (2006.01)
*F04D 29/54* (2006.01)
*H05K 5/00* (2006.01)

(52) U.S. Cl. .................. 361/695; 361/679.48; 415/206; 415/219.1; 165/80.3; 454/184; 174/547; 363/141; 417/360

(58) Field of Classification Search .................. 361/695, 361/679.48–679.49; 415/206, 193, 219.1; 165/80.3; 454/184; 174/547, 17 VA; 363/141; 417/360, 423.5; 439/619
See application file for complete search history.

(56) References Cited

U.S. PATENT DOCUMENTS

| | | | | |
|---|---|---|---|---|
| 5,926,367 | A * | 7/1999 | Gutierrez et al. | 361/695 |
| 7,434,743 | B2 * | 10/2008 | Barsun et al. | 236/49.3 |
| 7,492,591 | B1 * | 2/2009 | Aybay et al. | 361/695 |
| 7,729,116 | B1 * | 6/2010 | Aybay et al. | 361/695 |

* cited by examiner

*Primary Examiner* — Zachary M Pape
(74) *Attorney, Agent, or Firm* — Harrity & Harrity, LLP

(57) ABSTRACT

A reversible fan tray device is provided for a power supply unit. The fan tray device includes a mounting panel to be removably mounted to the power supply, a fan unit secured to the mounting panel to provide airflow through the electronic device, and an interconnection board secured to the mounting panel to provide an electrical connection between the fan unit and the power supply unit. The mounting panel can be positioned in either of two orientations, the first orientation to draw external air into the power supply unit and the second orientation to force internal air out of the power supply unit. The interconnection board mates with a connector on the power supply unit when the fan tray cassette is in either of the two orientations. The interconnection board provides an airflow direction indication to the power supply unit for an existing orientation of the two orientations.

20 Claims, 8 Drawing Sheets

POWER SUPPLY WITH REVERSIBLE AIRFLOW DESIGN

BACKGROUND

Electronic devices may be used in many types of systems and/or applications, such as control systems, data processing systems, medical systems, telecommunication systems and/or communication networks. Electronic devices may include system controllers, servers, and/or network devices, such as routers, switches, firewalls, and/or network address translators.

In data centers, electronic devices may be installed within a networking rack to provide, for example, a scalable system. Electronic devices may be arranged within the networking rack to provide optimum connectivity with other electronic devices. In addition, airflow direction in networking racks is typically required to go from a cold side to a hot side. The airflow direction through the electronic devices may be changed to accommodate these airflow requirements. Power supply units within electronic devices may include a separate airflow for cooling of the power supply units. When airflow direction through the electronic device is changed, optimal cooling performance may be achieved by also changing the airflow direction through the power supply unit. Often this is required in order to prevent the power supply unit from drawing in hot air from the electronic device itself.

SUMMARY

In one implementation, a reversible fan tray device for a power supply unit is provided. The reversible fan tray device includes a mounting panel to be removably mounted to the power supply unit, a fan unit secured to the mounting panel to provide airflow through the power supply unit, and an interconnection board secured to the mounting panel to provide an electrical connection between the fan unit and the power supply unit. The mounting panel may be positioned in either of two orientations, the first orientation to draw external air into the power supply unit and the second orientation to force internal air out of the power supply unit. The interconnection board can mate with a mating connector on the power supply unit when the reversible fan tray device is in either of the two orientations.

In another implementation, a power supply unit for an electronic device is provided. The power supply unit includes a housing to retain components of the power supply unit; a reversible fan tray device removably mounted to the housing of power supply unit, where the reversible fan tray device is positioned in either of two orientations, the first orientation to draw external air into the power supply unit and the second orientation to force internal air out of the power supply unit; and a mating connector operatively connected to the reversible fan tray device to identify which of the first and second orientations is currently installed.

In a further implementation, a method may include removably mounting a reversible fan tray device to a power supply unit; operatively connecting the reversible fan tray device to the power supply unit in a first orientation, where the first orientation provides airflow through the power supply unit in one direction; operatively connecting the reversible fan tray device to the power supply unit in a second orientation, where the second orientation provides airflow through the power supply unit in another direction; and providing an airflow direction indication to the power supply unit for the first orientation or the second orientation.

In yet another implementation, a method is provided for reversing airflow through a power supply unit having a reversible fan tray device. The method includes determining a required airflow direction for an electronic device associated with the power supply unit; identifying a different existing airflow direction for the power supply unit; removing the reversible fan tray device from the power supply unit; rotating the reversible fan tray device from a first orientation to a second orientation relative to the power supply unit; and reconnecting, in the second orientation, the reversible fan tray device to the power supply unit.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements. Also, the following detailed description does not limit the invention.

Implementations described herein may provide a power supply unit with reversible airflow for electronic devices. The power supply unit with reversible airflow may include a power supply unit and a reversible fan tray device that can be mounted within the power supply unit in different orientations so that each orientation provides airflow in an opposite direction. The reversible fan tray device may include one or more fans that are cable harnessed together. The cable harness may be configured with two alternative connectors to mate with a mating connector on the power supply unit when the reversible fan tray device is in either orientation. The cable harness may provide an airflow direction indication to the power supply unit and/or a main system board.

Exemplary Electronic Device

Figure 1:
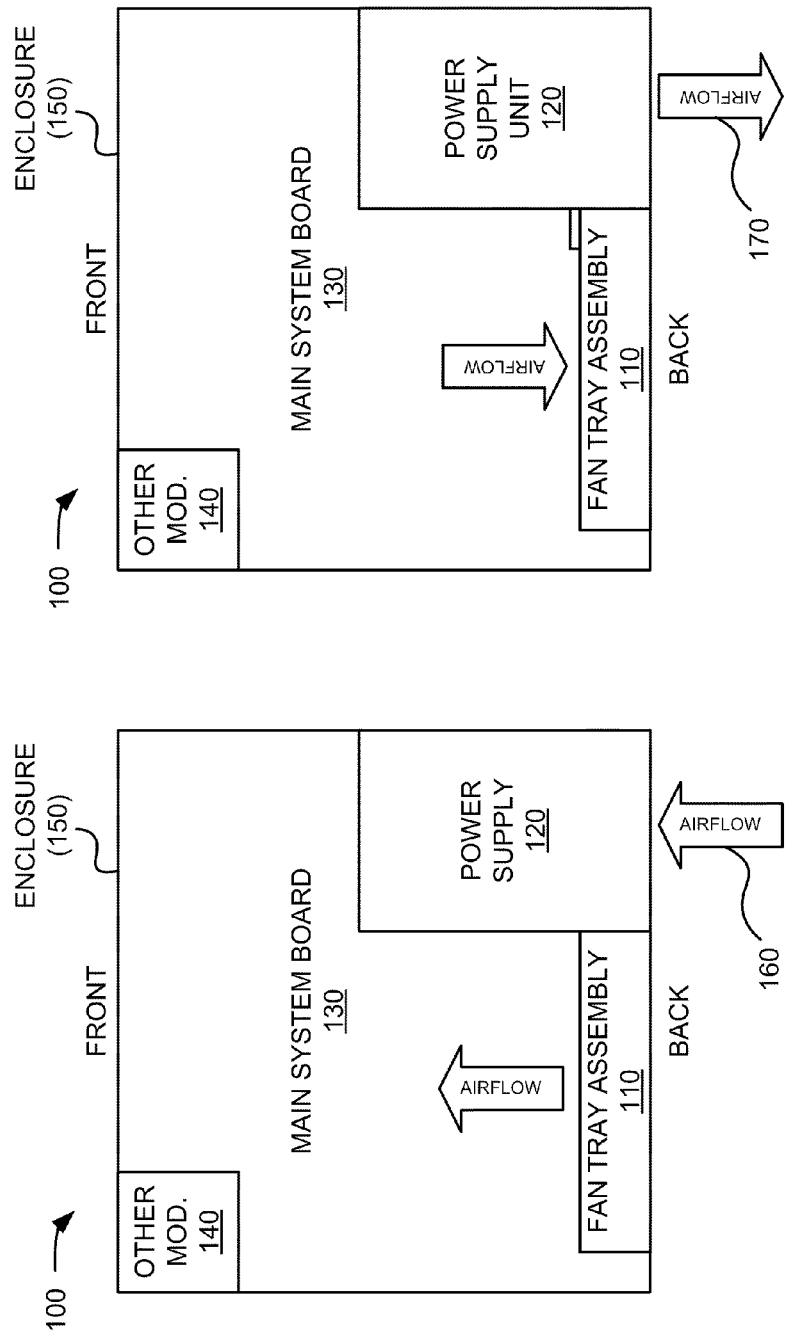
FIGS. 1A and 1B illustrate a top view of an exemplary electronic device in which a power supply unit with reversible airflow may be implemented.

FIGS. 1A and 1B illustrate a top view of exemplary electronic device 100 in which a power supply unit 120 with reversible airflow may be implemented. In implementations herein, electronic device 100 may take the form of a system controller, a server, a router, a switch, a firewall, a network address translator and/or another network device. In another implementation, electronic device 100 may be a non-networking device. As shown in FIGS. 1A and 1B, electronic device 100 may include a fan tray assembly 110, a power supply unit 120, a main system board 130, one or more other modules 140, and an enclosure 150.

Fan tray assembly 110 may provide a fan unit that may be installed in either of two orientations within electronic device 100. Depending on the orientation of installation, fan tray assembly 110 may provide airflow in different directions. As shown in FIG. 1A, in one orientation, fan tray assembly 110 may draw air into the back of electronic device 100. As shown in FIG. 1B, in another orientation, fan tray assembly 110 may force air out of the back of electronic device 100.

Power supply unit 120 may include any device capable of providing power to devices operating in electronic device 100, such as fan tray assembly 110, main system board 130, other modules 140 and/or other components of electronic device 100. Power supply unit 120 may be configured to perform voltage and/or current conversion and may include one or more inputs and/or outputs. In one implementation, power supply unit 120 may accept an alternating current (AC) from a wall receptacle and provide a direct current (DC) to devices operating within electronic device 100.

Power supply unit 120 may also include a reversible fan tray to provide airflow for cooling power supply unit 120. Depending on the orientation of the fan tray installation, power supply unit 120 may provide airflow in different directions. As shown in FIG. 1A, in one orientation, power supply unit 120 may draw air into the back of electronic device 100 (illustrated by airflow indicator 160). As shown in FIG. 1B, in another orientation, power supply unit 120 may force air out of the back of electronic device 100 (illustrated by airflow indicator 170).

Main system board 130 may include a main system board of electronic device 100. Main system board 130 may perform a variety of processing functions associated with the intended purpose of electronic device 100 (e.g., system controller, server, network device, etc.). Main system board 130 may also include various connectors to operatively connect main system board 130 to other components of electronic device 100. In implementations described herein, main system board 130 may monitor orientations of components within electronic device 100 (e.g., fan tray assembly 110, power supply unit 120, etc.) to ensure consistent airflow through electronic device 100.

Other modules 140 may include one or more switches, communication ports, cards, transceivers, and/or other modules that may change or enhance capabilities of electronic device 100. Other modules 140 may be optional components.

Enclosure 150 may include any structure that can be configured to act as a housing to retain and/or protect fan tray assembly 110, power supply unit 120, main system board 130, other modules 140, and/or other components that may be used to facilitate operation of electronic device 100. Enclosure 150 may be fabricated from metal, plastic and/or composite and may be sized for particular applications. In one implementation, enclosure 150 may be sized to fit an industry standard mounting structure, such as a networking rack. Enclosure 150 may include one or more mounting flanges (not shown) to facilitate attachment of enclosure 150 to a mounting structure, such as a networking rack. The mounting flange may include one or more mounting holes for accepting fasteners, such as machine screws, for use in attaching electronic device 100 to the mounting structure.

Although FIGS. 1A and 1B show exemplary components of electronic device 100, in other implementations, electronic device 100 may contain fewer, different, differently arranged, or additional components than depicted in FIGS. 1A and 1B.

In still other implementations, one or more components of electronic device 100 may perform one or more other tasks described as being performed by one or more other components of electronic device 100.

Figure 2:
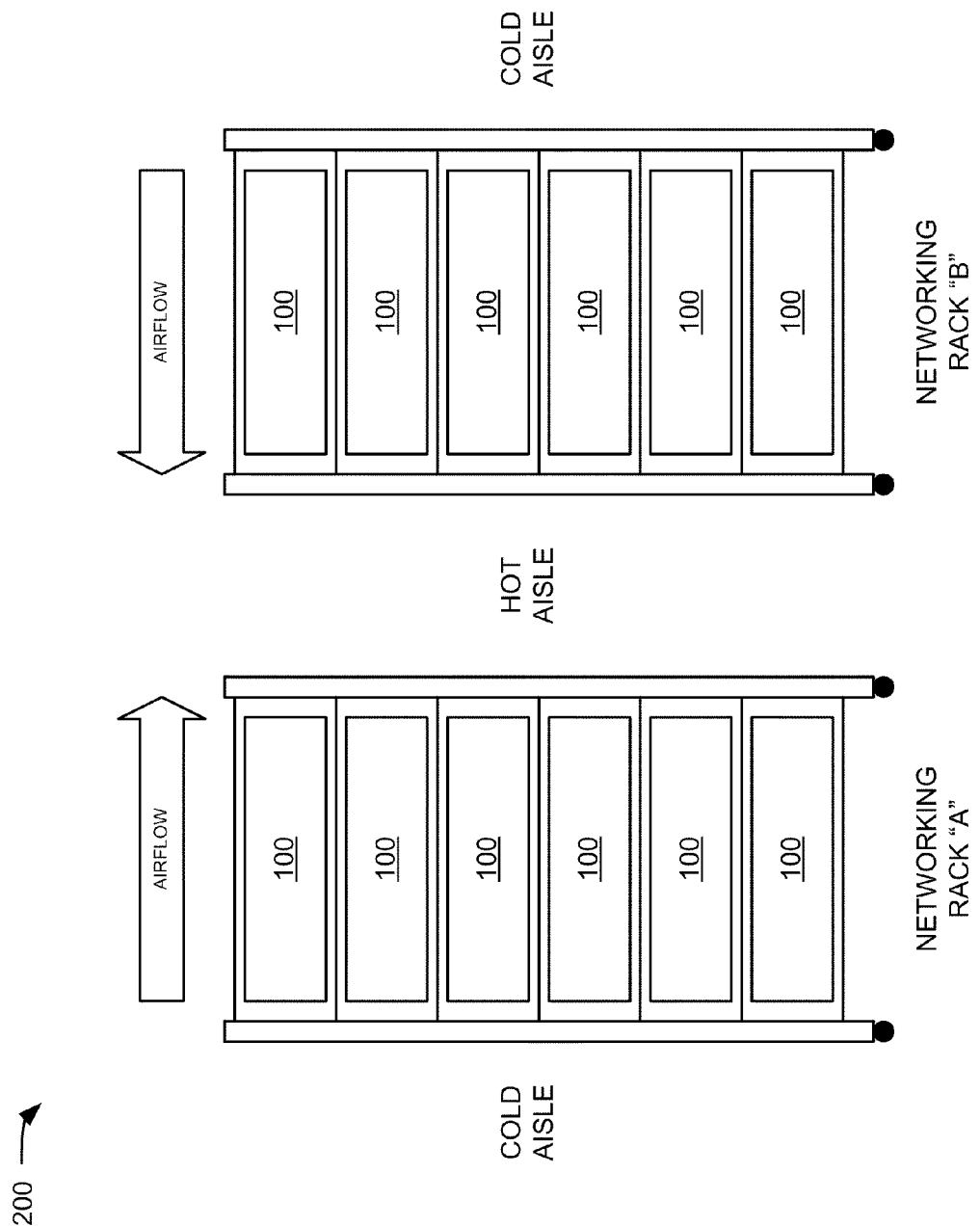
FIG. 2 illustrates a side view of an exemplary network rack system configured to accept multiple electronic devices.

FIG. 2 illustrates a side view of an exemplary network rack system 200 configured to accept multiple electronic devices 100. Network rack system 200 may include multiple networking racks that may be arranged so that airflow through each electronic device 100 in the networking racks provides airflow from a cold aisle to a hot aisle. The arrangement of electronic devices 100 within a networking rack (e.g., to accommodate system upgrades, new requirements, etc.) may require reorientation (e.g., from front-facing to rear-facing within a networking rack) or relocation (e.g., from one networking rack to another networking rack) of one or more electronic devices 100 while maintaining airflow from a cold aisle to a hot aisle. As described further herein, electronic device 100 may include power supply unit 120 with reversible airflow to quickly change (e.g., as a field modification) the airflow of power supply unit 120 within electronic device 100 to permit a relocation and/or reorientation while maintaining networking rack airflow requirements.

In implementations described further herein, a field technician may install or reposition an electronic device 100 including power supply unit 120 with reversible airflow. To reverse the airflow in power supply unit 120, the field technician may remove reversible fan tray device 330 from power supply unit 120, reposition the reversible fan tray, and reinstall power supply unit 120 within electronic device 100 to achieve a reversed airflow. Thus, modifications to the airflow of power supply unit 120 can be made as a simple field change, allowing greater flexibility in the arrangement of electronic devices 100 within network rack system 200. Also, modifications to the airflow of power supply unit 120 can be made without the need for additional parts.

Exemplary Power Supply with Reversible Airflow

Figure 3A:
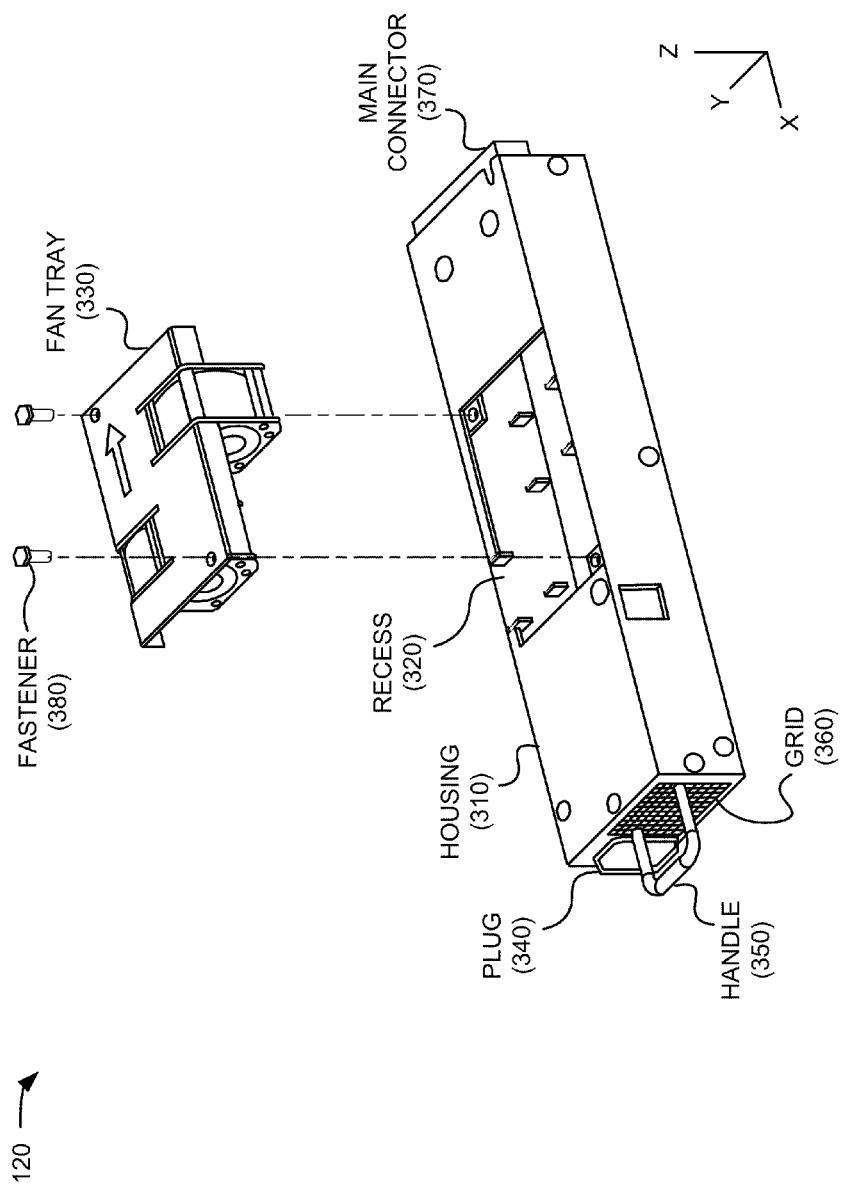
FIG. 3A illustrates an isometric view of an exemplary power supply unit with reversible fan tray device.
Figure 3B:
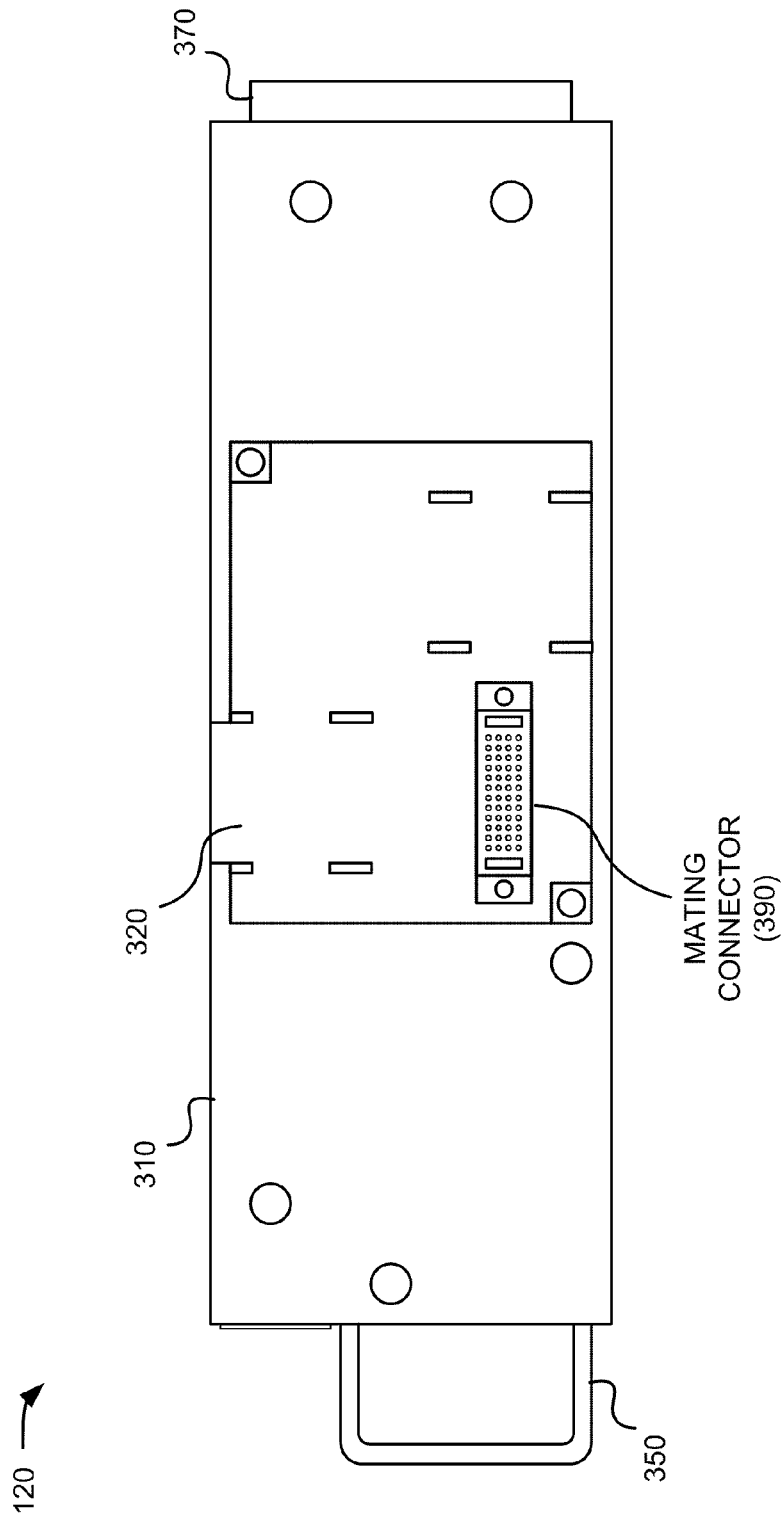
FIG. 3B illustrates a top view of the power supply unit of FIG. 3A.

FIG. 3A illustrates an isometric view of an exemplary power supply unit 120 with a reversible fan tray device 330. FIG. 3B illustrates a simplified top view of power supply unit 120 with the reversible fan tray device 330 removed for clarity. As shown in FIG. 3A, power supply unit 120 may include a housing 310, a fan tray recess 320, a reversible fan tray device 330, a plug 340, a handle 350, a grid 360, a main connector 370, and fasteners 380. As shown in FIG. 3B, power supply unit 120 may also include a mating connector 390.

Referring collectively to FIGS. 3A and 3B, housing 310 may include any structure that can be configured to retain and/or protect reversible fan tray device 330, plug 340, handle 350, grid 360, main connector 370, and/or other components that may be used to facilitate operation of power supply unit 120. Housing 310 may be fabricated from metal, plastic and/or composite and may be sized for particular applications. In one implementation, housing 310 may be sized to fit an industry standard electronic device, such as a 1U or 2U rackmount chassis. Housing 310 may include one or more flanges (e.g., within fan tray recess 320) to facilitate removable attachment of reversible fan tray device 330 to a housing 310. The flanges may include one or more mounting holes for accepting fasteners 380 for use in attaching reversible fan tray device 330 to a housing 310.

Fan tray recess 320 may include an opening within housing 310 to accept reversible fan tray device 330. Fan tray recess 320 may be configured to receive reversible fan tray device 330 in either of two orientations so that reversible fan tray device 330 may be aligned flush with a surface of housing 310 to facilitate insertion and/or removal of power supply unit 120 within electronic device 100. As described further herein, fan tray recess 320 may also provide access to mating connector 390 for an input/output connector of reversible fan tray device 330.

Reversible fan tray device 330 may include a mount for one or more fan units. In the exemplary implementation shown in FIG. 3A, two (2) fan units are shown. The fan units may be secured together to form a single reversible fan tray device 330. Reversible fan tray device 330 may be arranged in a substantially symmetrical manner along two axes (e.g., the x-axis and z-axis of FIG. 3A) so that reversible fan tray device 330 may be secured within fan tray recess 310 in either of two opposite orientations. In one orientation, reversible fan tray device 330 may be positioned to blow air out of housing 310 through grid 360. In the other orientation (as shown in FIG. 3A), reversible fan tray device 330 may be positioned to draw air into housing 310 through grid 360. As described further herein, reversible fan tray device 330 may include a cable harness or other mechanism may provide an electrical connection between the fan units and power supply unit 120. Further details of reversible fan tray device 330 are provided below in connection with, for example, FIGS. 4A-5B.

Plug 340 may include a standard electrical receptacle to receive a power cord for alternating current (AC) from, for example, a wall receptacle. Handle 350 may be secured to housing 310 to facilitate insertion and/or removal of power supply unit 120 to/from electronic device 100. Other mechanisms (not shown) may be used to secure power supply unit 120 within electronic device 100. When these other mechanisms are released, a user (e.g., field technician) may slide power supply unit 120 from electronic device 100 using handle 350.

Grid 360 may include openings to allow airflow into and out of housing 310 and to act as a filter against debris. While a single grid 360 is shown in FIG. 3A, other grids and/or openings may be included in power supply unit 120 to accommodate airflow through power supply unit 120. Main connector 370 may include a device, mechanism and/or structure capable of making electrical power and/or signals available between power supply unit 120 and an electronic device 100 having a mating connector associated therewith.

Each of fasteners 380 may include a machine screw configured to engage corresponding threaded holes provided in housing 310 and/or reversible fan tray device 330. Fasteners 380 may secure reversible fan tray device 330 to housing 310. In one implementation, fasteners 380 may be configured to receive a standard screwdriver so that reversible fan tray device 330 may be installed/removed by a field service technician. Alternatively and/or additionally, one or more of fasteners 380 may be replaced with a variety of other connection mechanisms, such as threaded bolts, clips, latches, adhesives, and/or similar connection mechanisms. Although FIG. 3A shows two fasteners 380, in other implementations, power supply unit 120 may include more or fewer than two fasteners 380 to secure reversible fan tray device 330 to housing 310. Fasteners 380 may also be used to secure other components of power supply unit 120 to housing 310.

Mating connector 390 may include a device, mechanism and/or structure capable of interfacing with connectors in reversible fan tray device 330 to make electrical power and/or signals available between power supply 120 and reversible fan tray device 330. Mating connector 390 may allow power supply unit 120 and/or main system board 130 to communicate with reversible fan tray device 330 and provide power (e.g., from power supply unit 120) to reversible fan tray device 330. In one implementation, mating connector 390 may enable power supply unit 120 to convey to main system board 130 information that includes, for example, airflow direction, fan speed, power supply health, a serial number, a model number, and/or up (e.g., operational) time.

In implementations described herein, power supply unit 120 may be reconfigured to provide airflow in the opposite direction by removing reversible fan tray device 330 (e.g., by removing fasteners 380 that secure reversible fan tray device 330 to housing 310), rotating reversible fan tray device 330 to the opposite orientation (e.g., rotating 180 degrees around the z-axis), and re-securing reversible fan tray device 330 to housing 310. Thus, power supply unit 120 may provide a single part (e.g., a single stock-keeping unit (SKU)) to accomplish two airflow directions for electronic device 100.

Although FIGS. 3A and 3B shows exemplary components of power supply unit 120, in other implementations, power supply unit 120 may contain fewer, different, differently arranged, or additional components than depicted in FIGS. 3A and 3B. In still other implementations, one or more components of power supply unit 120 may perform one or more other tasks described as being performed by one or more other components of power supply unit 120.

Exemplary Reversible Fan Tray

Figures 4A, 4B:
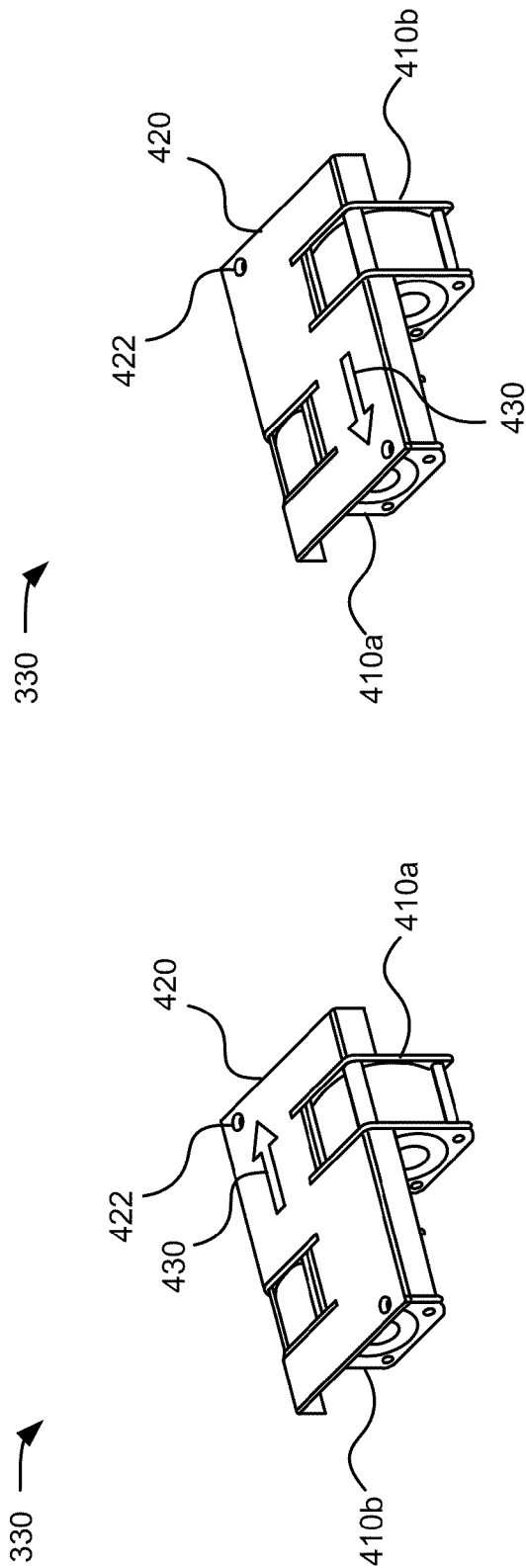
FIGS. 4A and 4B illustrate isometric views of different orientations of an exemplary reversible fan tray device for the power supply unit of FIG. 3A.

FIGS. 4A and 4B illustrate isometric views of different orientations of reversible fan tray device 330 for the power supply unit 120. As shown in FIGS. 4A and 4B, reversible fan tray device 330 may include multiple fan units 410a and 410b (referred to herein collectively as "fan units 410" and generically as "fan unit 410") secured to a mounting panel 420. The arrangement of fan units 410 and mounting panel 420 is substantially symmetrical, such that rotating reversible fan tray device 330 one hundred eighty (180) degrees (as shown by comparing FIGS. 4A and 4B) can reverse the airflow direction without changing the basic connectivity (e.g., footprint) of reversible fan tray device 330.

Fan unit 410 may include a device, mechanism and/or structure that may be used to draw air in and/or expel air from power supply unit 120. In an exemplary implementation, each fan unit 410 may include an identical standard 20 mm ball bearing fan. In some implementations, fan units 410 may include a filter. The quantity and size of fan units 410 (and the corresponding size of mounting panel 420) may be configured based on, for example, the required airflow capacity of power supply unit 120. Thus, while two fan units 410a and 410b are shown in FIGS. 4A and 4B, additional or fewer fan units 410 may be used in other implementations provided the fan units 410 care is arranged to provide a reversible configuration. Also, in one implementation, differently sized fan units 410 may be used within the same reversible fan tray device 330.

Mounting panel 420 may include a device, mechanism and/or structure that may be configured to support fan units 410 and/or an interconnection board while allowing airflow through fan units 410. Mounting panel 420 may be fabricated from metal, plastic and/or composite and may be sized to fit within fan tray recess 320 of power supply unit 120.

Mounting panel 420 may include airflow direction indicator 430 to allow a user to visually determine the airflow direction for a particular orientation of reversible fan tray device 330. In one implementation, airflow direction indicator 430 may be etched into a visible portion of mounting panel 420. Thus, as shown in FIG. 4A, the airflow for reversible fan tray device 330 may be oriented in one direction (e.g., to provide airflow out of the back of power supply unit 120);

while as shown in FIG. 4B, the airflow for reversible fan tray device 330 may be oriented in the opposite direction (e.g., to draw air from the back of power supply unit 120).

Mounting panel 420 may include one or more holes 422 to facilitate removable attachment of reversible fan tray device 330 to a structure, such as housing 310. Holes 422 may be configured to accept fasteners (e.g., fasteners 380) for use in attaching reversible fan tray device 330 to housing 310. In one implementation, holes 422 may be configured to accept standard machine screws that can be installed/removed by a technician using a standard screwdriver.

Figure 5A:
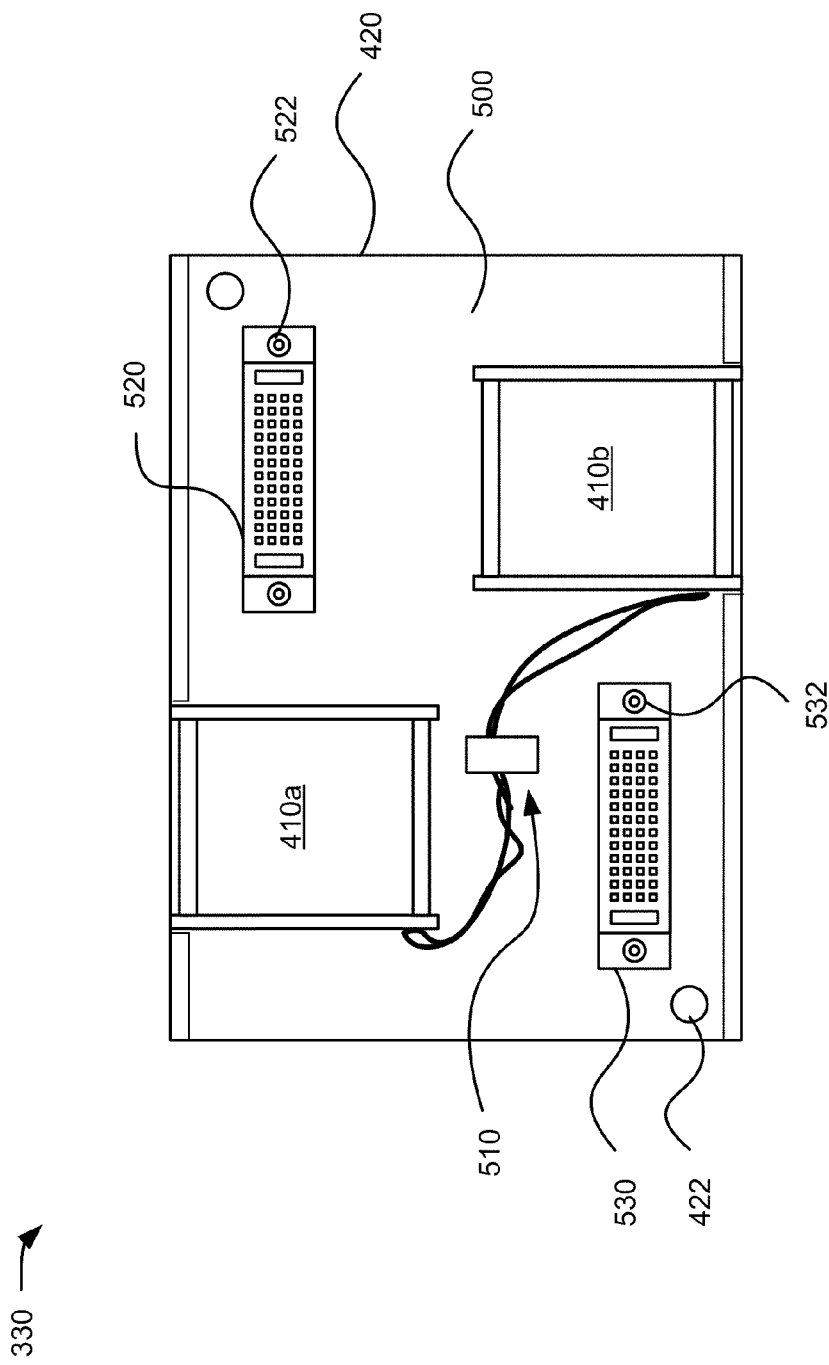
FIGS. 5A and 5B illustrate bottom and side views, respectively, of the reversible fan tray device for the power supply unit of FIG. 3A.
Figure 5B:
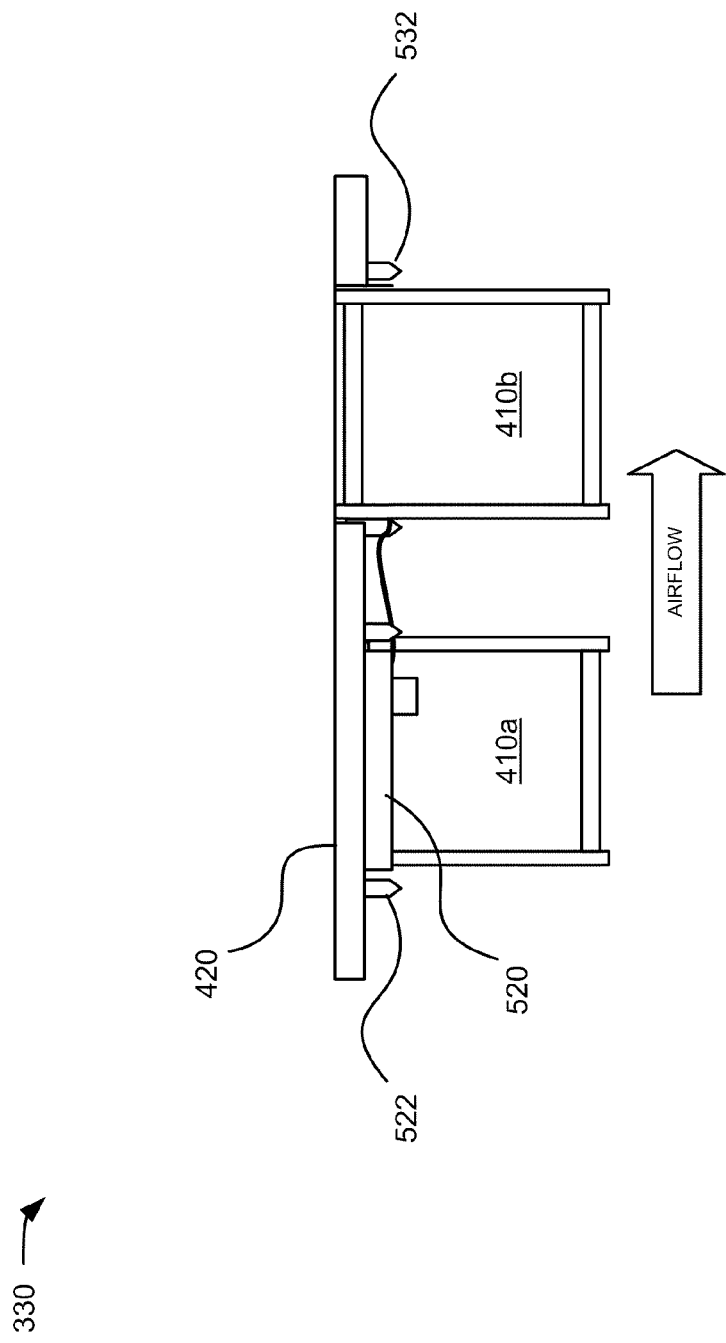

FIGS. 5A and 5B illustrate bottom and side views, respectively, of reversible fan tray device 330. FIG. 5A shows a simplified underside of reversible fan tray device 330, which includes that interconnection board 500, input/output connectors 520 and 530 (referred to herein collectively as "I/O connectors 520 or 530" and generically as "I/O connector 520" and "I/O connector 530"), cable harness 510 and fan units 410. Other components, such a mounting flanges, fasteners, cable clips, etc. are not shown in FIGS. 5A and 5B for clarity.

Interconnection board 500 may provide an electrical connection between the fan units 410, connectors 520/530, and power supply unit 120. Interconnection board 500 may be configured such that either connector 520 or connector 530 mates with a single connector on housing 310 (e.g., within fan tray recess 320) depending on the orientation of reversible fan tray device 330. Interconnection board 500 may include, for example, a printed circuit (PC) board mounted to mounting structure 500 to provide electrical connections among components mounted on interconnection board 500.

Cable harness 510 may include a device, mechanism and/or structure that may be configured to receive cables from fan units 410 and provide an interface with interconnection board 500.

I/O connectors 520 and 530 may each include any device, mechanism and/or structure capable of making electrical power and/or signals available between reversible fan tray device 330 and a component (e.g., power supply unit 120) having a mating connector (e.g., mating connector 390) associated therewith. In one implementation, I/O connectors 520 and 530 may each include a multi-pin connector configured and arranged to receive mating connector 390 mounted on a cable in communication with another component, such as a cable connected to power supply unit 120. As shown in FIGS. 5A and 5B, guide posts 522 or 532 may be configured to receive alignment holes in a mating connector (e.g., mating connector 390) to ensure proper alignment of I/O connector 520 or 530 with the mating connector.

I/O connectors 520 and 530 may be arranged 180 degrees out of phase (with respect to an extending perpendicular to the plane of interconnection board 500) such that either of I/O connector 520 or 530 may form a connection with a single mating connector 390 when reversible fan tray device 330 is installed within fan tray recess 320. Interconnection board 500 may provide an airflow direction indication to power supply unit 120 and/or main system board 130 via, for example, inclusion of an open ground pin on one of the I/O connectors (e.g., I/O connector 520) and a closed ground pin on the other of the I/O connectors (e.g., I/O connector 530). Thus, power supply unit 120 and/or main system board 130 may be able to determine the installed airflow for reversible fan tray device 330 and ensure airflow consistency with other components within electronic device 100 or with other electronic devices.

Although FIGS. 4A through 5B show exemplary components of reversible fan tray device 330, in other implementations, reversible fan tray device 330 may contain fewer, different, differently arranged, or additional components than depicted in FIGS. 4A through 5B. In still other implementations, one or more components of reversible fan tray device 330 may perform one or more other tasks described as being performed by one or more other components of reversible fan tray device 330.

Exemplary Process

Figure 6:
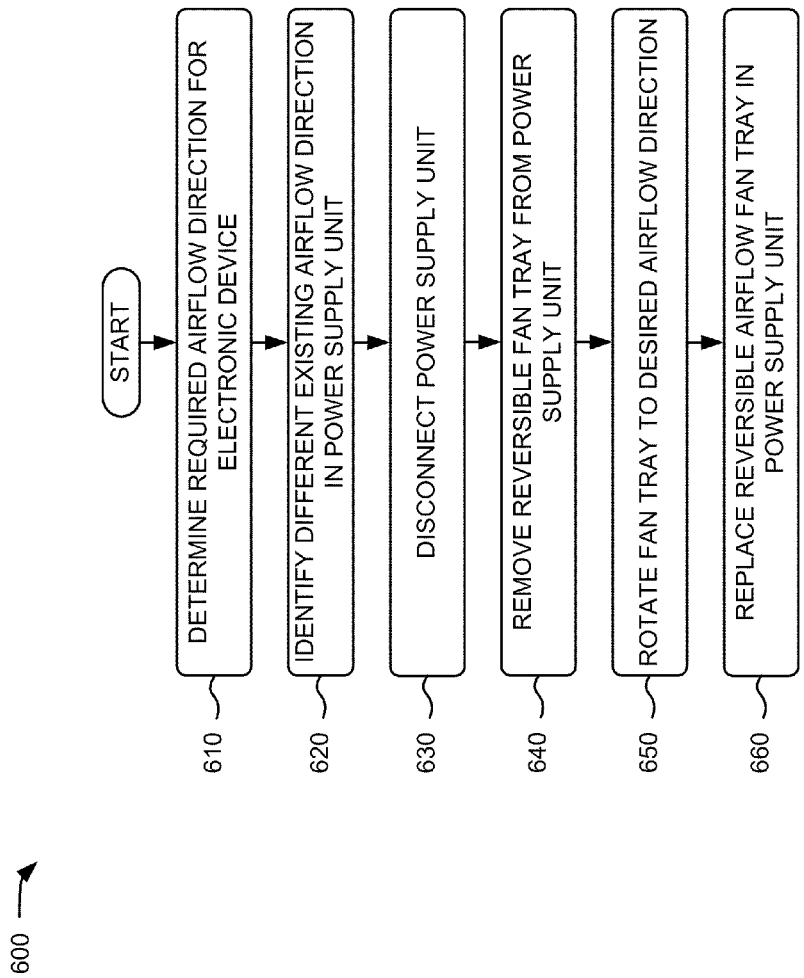
FIG. 6 is a flowchart of an exemplary process for reversing the air flow for a power supply unit of an electronic device according to implementations described herein.

FIG. 6 is a flowchart of an exemplary process 600 for reversing the air flow for a power supply unit 120 according to implementations described herein. As shown in FIG. 6, process 600 may include determining a required airflow direction for a power supply unit 120 in an electronic device 100 (block 610), and identifying a different existing airflow direction (block 620). For example, in implementations described above in connection with FIGS. 1A, 1B and 2, a field technician may install or reposition an electronic device 100 including a power supply unit 120 with reversible airflow. Power supply unit 120 may have an existing airflow that, due to a change in position of electronic device 100, must be reversed to meeting required airflow configurations.

As further shown in FIG. 6, the power supply unit 120 may be disconnected (block 630). For example, in implementations described above in connection with FIGS. 1A, 1B and 3A, a user may disengage any latching mechanisms and remove power supply unit 120 from electronic device 100 by pulling handle 350.

The reversible fan tray device 330 may be removed from the power supply unit 120 (block 640), and the reversible fan tray device 330 may be rotated to the desired airflow direction (block 650). For example, in implementations described above in connection with FIGS. 3A through 4B, reversible fan tray device 330 may be removed from power supply unit 120 by removing fasteners 380 from holes 422 and/or the mounting flanges within fan tray recess 320 of power supply unit 120. With fasteners 380 removed, I/O connector 520 may be detached from mating connector 390 to allow removal of reversible fan tray device 330. Reversible fan tray device 330 may then be may be flipped to the opposite side (e.g., rotated 180 degrees around the axis perpendicular to mounting panel 420) from its original orientation to reverse the airflow direction.

The reversible fan tray device 330 may be replaced in the power supply unit 120 (block 660). For example, in implementations described above in connection with FIGS. 1A, 1B and 3A, reversible fan tray device 330 may be reattached to power supply unit 120 using fasteners 380. The airflow for power supply unit 120 will now be oriented in the opposite direction of the original airflow. The engaged I/O connectors (e.g., I/O connector 520 or I/O connector 530) of interconnection board 500 on reversible fan tray device 330 may be connected to mating connector 390 within the fan tray recess 320 of power supply unit 120.

CONCLUSION

Implementations described herein may provide a reversible fan tray device for a power supply unit. The reversible fan tray device may include a mounting panel to be removably mounted to the power supply unit, a fan unit secured to the mounting panel to provide airflow through the electronic device, and an interconnection board secured to the mounting panel to provide an electrical connection between the fan unit and the power supply unit. The mounting panel can be positioned in either of two orientations, the first orientation to draw external air into the power supply unit and the second orientation to force internal air out of the power supply unit. The interconnection board can mate with a mating connector on the power supply unit when the reversible fan tray device is in either of the two orientations. The interconnection board may provide an airflow direction indication to the power supply unit for an existing orientation of the two orientations.

The foregoing description of implementations provides illustration and description, but is not intended to be exhaustive or to limit the invention to the precise form disclosed. Modifications and variations are possible in light of the above teachings or may be acquired from practice of the invention.

For example, while reversible fan tray device 330 has been described as being in one of two possible orientations, in other implementations, reversible fan tray device 330 may have more than two possible orientations within power supply unit 120 (e.g., airflows oriented through a top, bottom, left, right, back, front and combinations thereof). Also, while a series of blocks has been described with regard to FIG. 6, the order of the blocks may differ in other implementations. Further, non-dependent blocks may be performed in parallel.

Also, systems described herein can be implemented using assemblies and parts other than those illustrated in the figures and described in the specification without departing from the spirit of the invention. Parts may be added and/or removed from power supply unit 120 and/or reversible fan tray device 330 depending on specific deployments and/or applications. Further, disclosed implementations may not be limited to any specific combination of hardware.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A reversible fan tray device for a power supply unit, the reversible fan tray device comprising:
   a mounting panel to be removably mounted to the power supply unit;
   a fan unit secured to the mounting panel to provide airflow through the power supply unit, and
   an interconnection board secured to the mounting panel to provide an electrical connection between the fan unit and the power supply unit,
   where the mounting panel is to be positioned in either of two orientations, a first orientation to draw external air into the power supply unit and a second orientation to force internal air out of the power supply unit, and where the interconnection board mates with a connector on the power supply unit when the reversible fan tray device is in either of the two orientations.

2. The device of claim 1, where the interconnection board provides an airflow direction indication to the power supply unit for an existing orientation of the two orientations.

3. The device of claim 1, where the reversible fan tray device is to fit within the power supply unit for a standard-size rackmount chassis.

4. The device of claim 1, where the mounting panel includes an airflow direction indicator on a surface visible to a user.

5. The device of claim 1, where the interconnection board comprises:
   a first input/output connector to provide a connection when the reversible fan tray device is in one of the two orientations, and
   a second input/output connector to provide a connection when the reversible fan tray device is in another of the two orientations.

6. The device of claim 5, further comprising a cable harness to connect multiple fan units.

7. The device of claim 5, where the first input/output connector includes an open ground pin to identify one of the two orientations, and the second input/output connector includes a closed ground pin to identify the other of the two orientations.

8. A power supply unit for an electronic device, the power supply unit comprising:
   a housing to retain components of the power supply unit;
   a reversible fan tray device removably mounted to the housing of the power supply unit, where the reversible fan tray device is positioned in either of two orientations, the first orientation to draw external air into the power supply unit and the second orientation to force internal air out of the power supply unit; and
   a mating connector operatively connected to the reversible fan tray device to identify which of the first and second orientations is currently installed.

9. The power supply unit of claim 8, where
   the mating connector to allow the power supply unit to communicate with the reversible fan tray device and to provide power from the power supply unit to the reversible fan tray device.

10. The power supply unit of claim 8, where the reversible fan tray device comprises:
    a fan unit to provide airflow through the power supply unit, and
    an interconnection board to provide an electrical connection between the fan unit and the power supply unit, where the interconnection board is configured to mate with the mating connector on the power supply unit when the reversible fan tray device is in either of the two orientations.

11. The power supply unit of claim 8, where the housing is sized for a standard-size rackmount chassis.

12. The power supply unit of claim 8, where the reversible fan tray device includes a visible airflow direction indicator.

13. The power supply unit of claim 8, where the reversible fan tray device comprises:
    a first input/output connector to provide a connection when the reversible fan tray device is in the first orientation, and
    a second input/output connector to provide a connection when the reversible fan tray device is in the second orientation.

14. The power supply unit of claim 13, where the first input/output connector includes an open ground pin to identify the first orientation, and the second input/output connector includes a closed ground pin to identify the second orientation.

15. The power supply unit of claim 8, where the electronic device comprises one of:
    a system controller,
    a server,
    a router,
    a switch,
    a firewall, or
    a network address translator.

16. A method, comprising:
    removably mounting a reversible fan tray device to a power supply unit;

operatively connecting the reversible fan tray device to the power supply unit in a first orientation, where the first orientation provides airflow through the power supply unit in one direction;

operatively connecting the reversible fan tray device to the power supply unit in a second orientation, where the second orientation provides airflow through the power supply unit in another direction; and providing an airflow direction indication to the power supply unit for the first orientation or the second orientation.

17. The method of claim 16, further comprising:

visually indicating the first orientation or the second orientation to a user.

18. A method for reversing airflow through a power supply unit having a reversible fan tray device, the method comprising:

determining a required airflow direction for an electronic device associated with the power supply unit;

identifying a different existing airflow direction for the power supply unit;

removing the reversible fan tray device from the power supply unit;

rotating the reversible fan tray device from a first orientation to a second orientation relative to the power supply unit; and reconnecting, in the second orientation, the reversible fan tray device to the power supply unit.

19. The method of claim 18, where the reversible fan tray device comprises an interconnection board that provides an airflow direction indication to the power supply unit for the first and second orientation.

20. The method of claim 18, where the first orientation causes the reversible fan tray device to draw external air into the power supply unit and the second orientation causes the reversible fan tray device to force internal air out of the power supply unit.

* * * * *